United States Patent [19]
Petersen

[11] Patent Number: 5,498,970
[45] Date of Patent: Mar. 12, 1996

[54] TOP LOAD SOCKET FOR BALL GRID ARRAY DEVICES

[75] Inventor: Kurt H. Petersen, Austin, Tex.

[73] Assignee: Minnesota Mining and Manufacturing, St. Paul, Minn.

[21] Appl. No.: 384,663

[22] Filed: Feb. 6, 1995

[51] Int. Cl.⁶ .................... G01R 1/04; H01R 13/629; H01R 13/62
[52] U.S. Cl. ................ 324/755; 439/261; 439/268
[58] Field of Search .................. 324/754, 755, 324/756, 758, 763, 765; 439/73, 74, 261, 266, 268

[56] References Cited

U.S. PATENT DOCUMENTS

| | | | |
|---|---|---|---|
| 4,969,828 | 11/1990 | Bright et al. | 439/68 |
| 5,057,031 | 9/1991 | Sinclair | 439/261 |
| 5,147,213 | 10/1992 | Funk et al. | 439/266 |
| 5,322,446 | 6/1994 | Cearley-Cabbiness | 439/73 |
| 5,374,888 | 12/1994 | Karasawa | 324/765 |

*Primary Examiner*—Kenneth A. Wieder
*Assistant Examiner*—Barry C. Bowser
*Attorney, Agent, or Firm*—Gary L. Griswold; Walter N. Kirn; David W. Anderson

[57] ABSTRACT

A test socket for temporary connection of a ball grid array integrated circuit device to a test circuit includes an array of contacts each including two cantilever arms biased toward each other and terminating in tips adapted to capture one ball of the device.

6 Claims, 6 Drawing Sheets

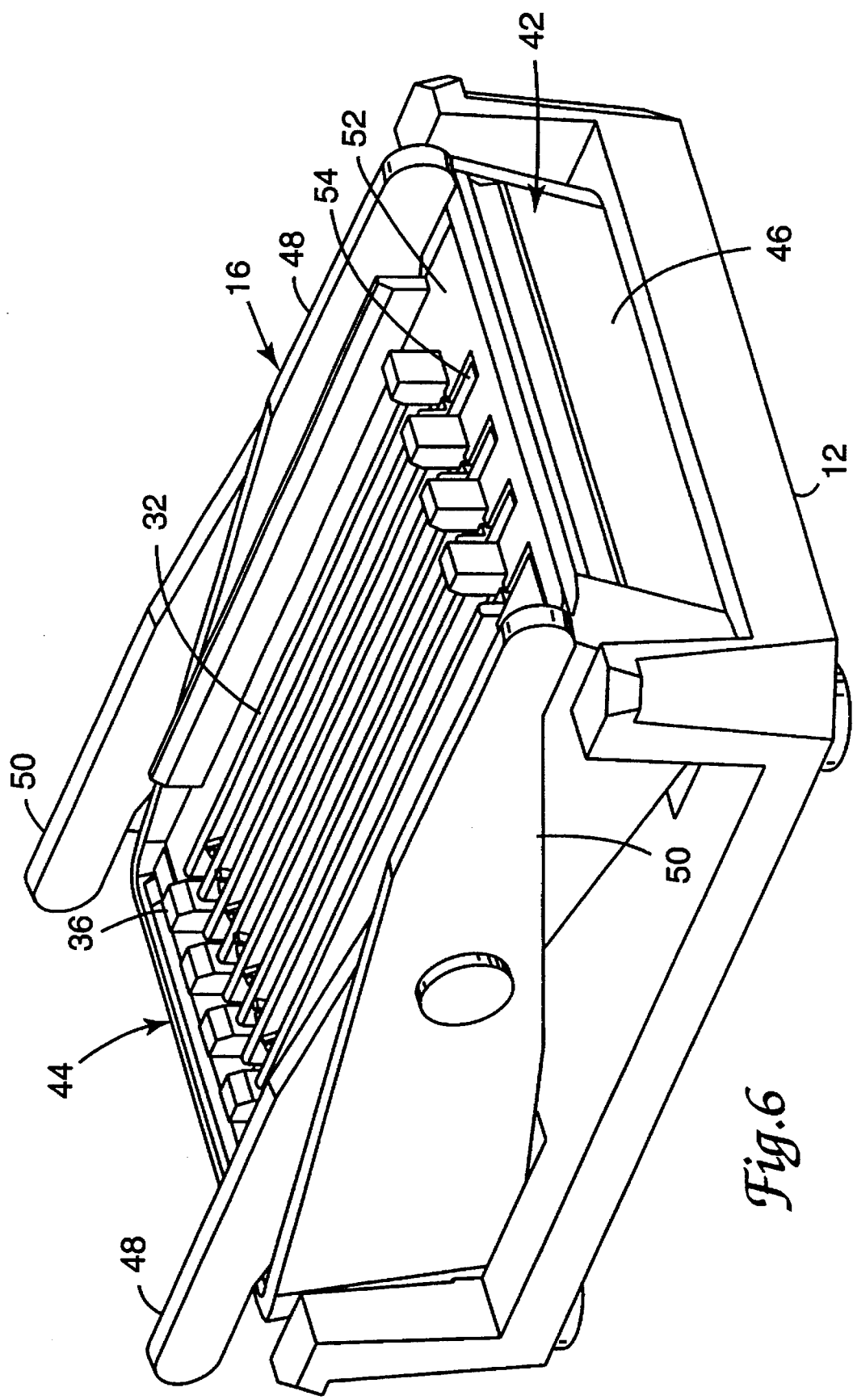

5,498,970

TOP LOAD SOCKET FOR BALL GRID ARRAY DEVICES

FIELD OF THE INVENTION

The present invention relates generally to sockets for the temporary connection of electronic devices to test circuitry, and, more particularly, sockets for ball grid array devices.

BACKGROUND OF THE INVENTION

Integrated circuit (IC) devices are finding wide-spread use in the electronics industry and before they are bonded to a circuit the same are tested to determine whether the IC device is functioning and that electrical continuity is present between the various portions of the device. To do this, the IC is placed in a socket which is attached to test circuitry. The whole assembly of test circuitry and IC may also be subjected to elevated temperatures while the IC is being electrically tested. Thus the procedure may be referred to as "test and burn-in" and the socket a test and burn-in socket.

One type of IC device is formed merely with small balls of solder attached to one planar surface of the device in a regular array of equally spaced rows and columns. Such a device is called a ball grid array (BGA) device and is designed to be mated to an interface circuit board by reflow soldering the BGA solder balls to an equal number of pads on the circuit board.

Test sockets for BGA devices in the past have contacted the solder balls with a single beam contact or a pointed rod contact which have caused undesirable damage to the solder balls or imparted unbalanced forces to the BGA device which had to be countered by the structure of the socket. It would be desirable to provide a socket which eliminated these undesirable effects.

SUMMARY OF THE INVENTION

The present invention improves upon existing BGA test sockets by providing a contact for each ball which is comprised of two cantilever arms terminating in inwardly-bent contact tips. The arms are arranged to be biased toward each other in the manner of a pair of tweezers. Since there are two contact arms, the forces on the contact balls of the BGA are balanced and thus no forces are transmitted to either the IC device or the socket structure supporting the contacts. Because the tips are inwardly bent, the balls are positively captured and the IC device securely maintained within the socket.

In particular, the test socket of the present invention includes a base of electrically insulating material, an array of contacts supported by the base, the array at least including a pattern of contacts corresponding to the ball grid array of the integrated circuit device, each contact including a set of two cantilever arms biased toward each other and terminating in tips adapted to capture one ball of the ball grid array integrated circuit device, and means for simultaneously separating each of the sets of the array of contacts so that the balls of the ball grid array device may be inserted one within each of the set of contact arms.

BRIEF DESCRIPTION OF THE DRAWINGS

The present invention will be more thoroughly described with respect to the accompanying drawings, wherein like numbers refer to like parts in the several views, and wherein:

FIG. 6 is a view similar to that of FIG. 5 with the test socket in a position to accept a BGA device.

DESCRIPTION OF THE PREFERRED EMBODIMENT

Figure 1:
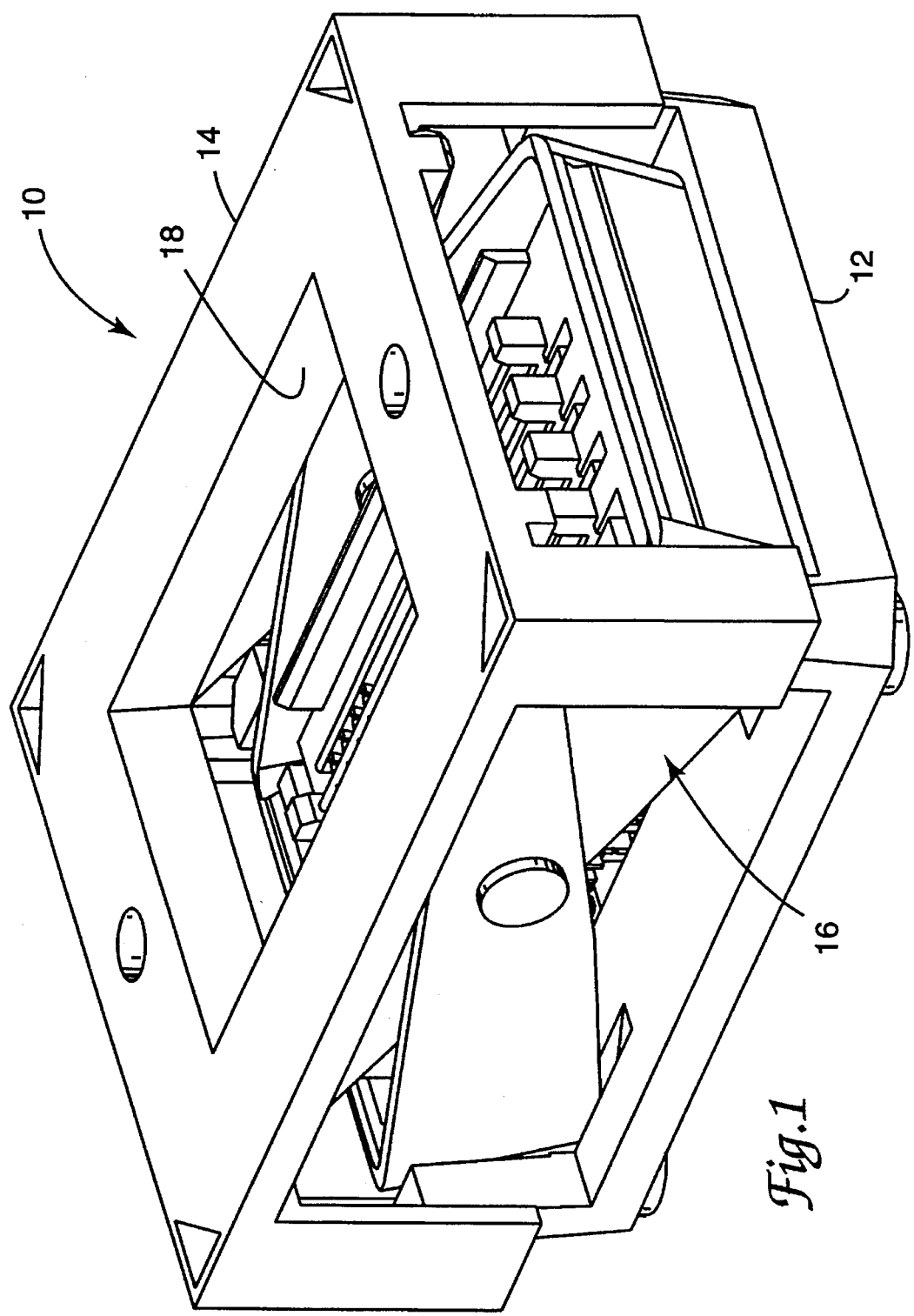
FIG. 1 is a perspective view of a BGA test socket according to the present invention.

FIG. 1 illustrates a ball grid array (BGA) socket generally indicated as 10. The socket 10 includes a base 12 of electrically insulating material, a cover 14 and an operating mechanism 16 disposed between the base 12 and the cover 14. The cover 14 includes an opening 18 in the shape of the BGA integrated circuit device (not shown) with which the socket 10 is to be used.

Figure 2:
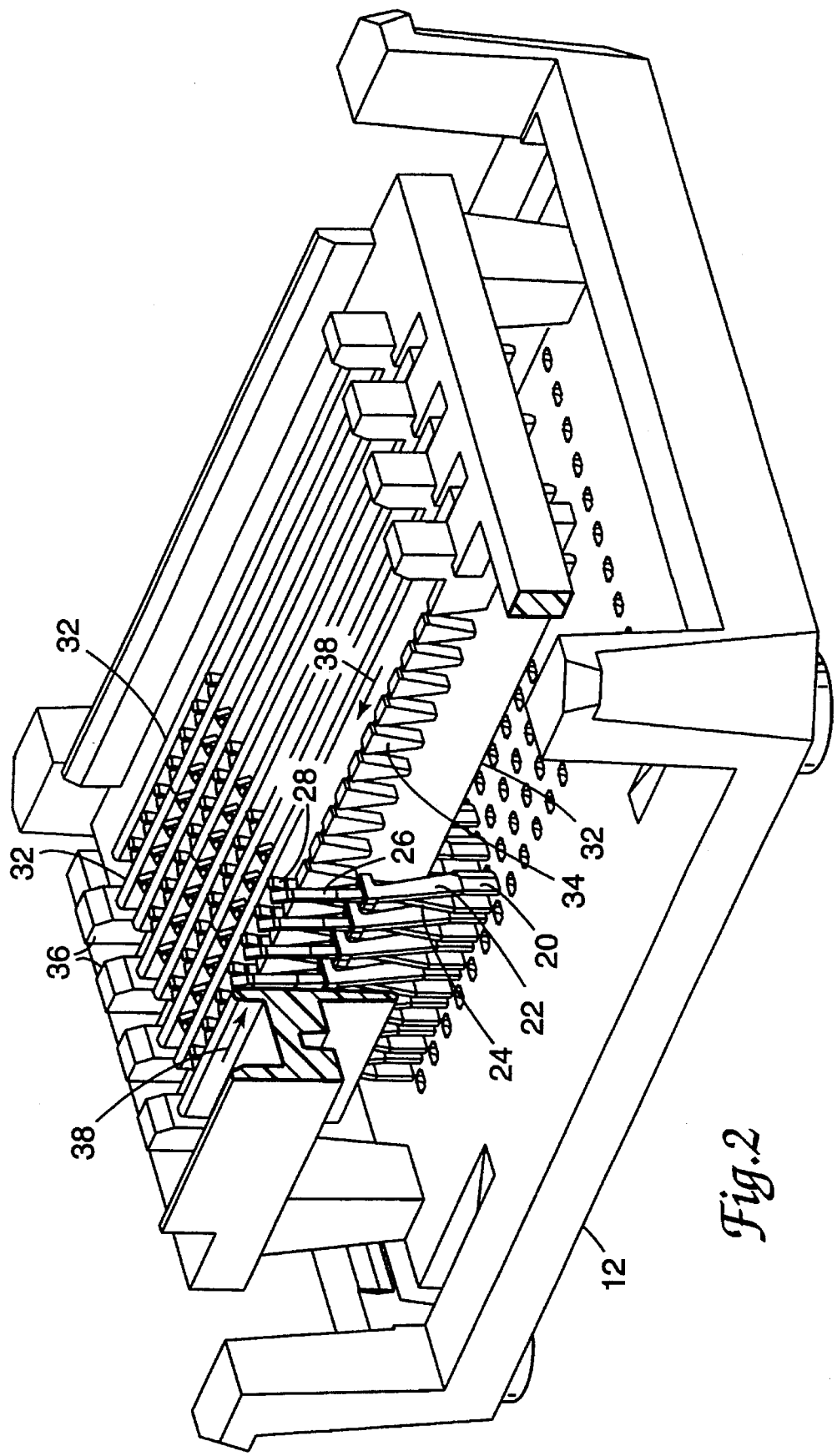
FIG. 2 is a perspective view of a pair of contacts designed for use in the socket of FIG. 1.
Figure 3:
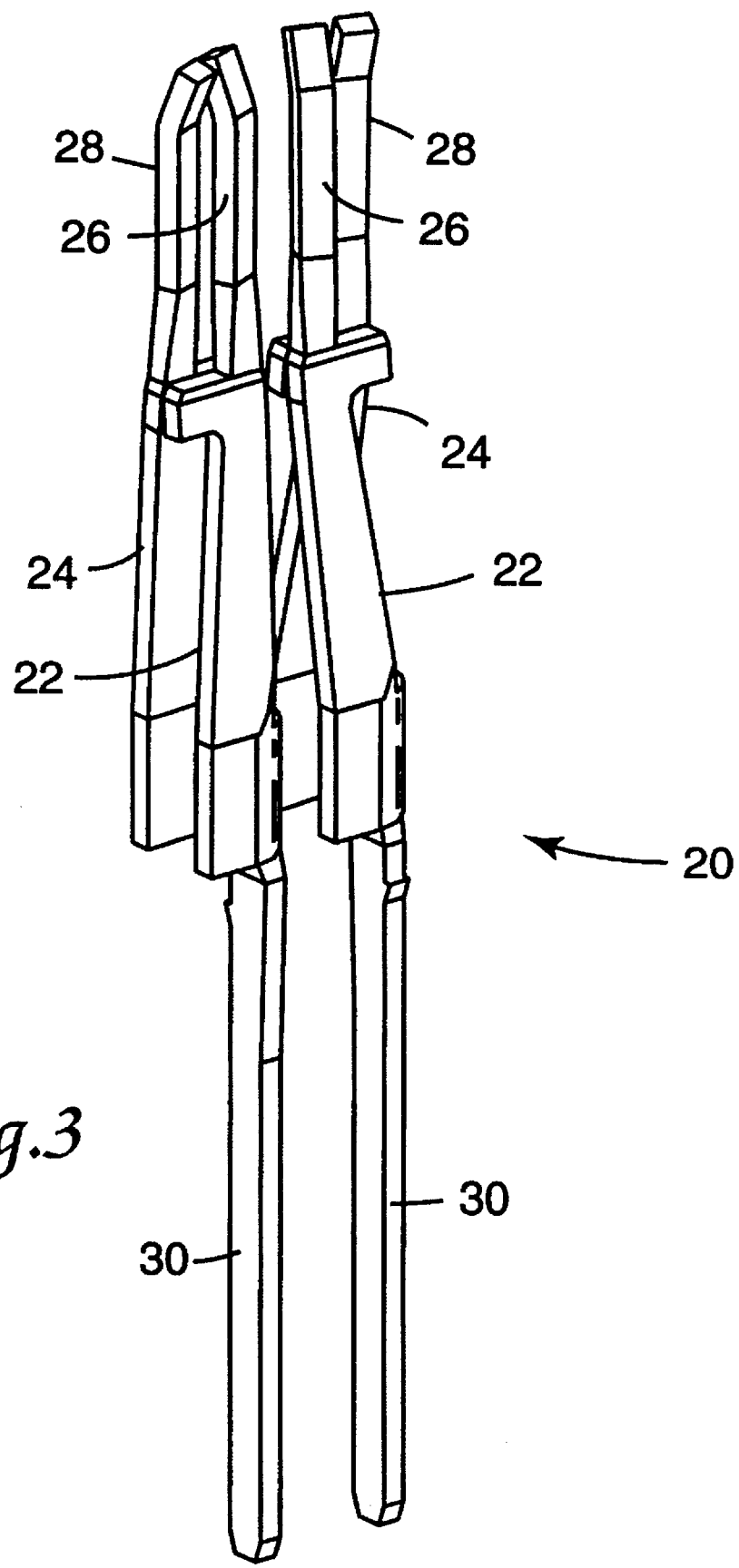
FIG. 3 is a perspective view of a portion of the socket of FIG. 1 illustrating the relationship between the contacts of FIG. 2 and the BGA IC device which is to be tested.

FIGS. 2 and 3 illustrate the contacts 20 disposed within the operating mechanism 16 of the socket 10 which are designed to make an electrical connection with the BGA device. Each contact 20 includes two cantilever arms 22 and 24 which terminate in tips 26 and 28 offset from each other relative to the direction of travel of the arms 22 and 24. The arms 22 and 24 are of a resilient, highly conductive metal such as copper or an alloy of copper, and so attempt to return to the position shown in FIG. 3 when the tips 26 and 28 are spread apart. The contacts 20 further include a tail 30 for electrical contact to a circuit board or the like.

FIG. 2 shows the tails 30 of the contacts inserted through the base 12, with the contacts arranged in an array of rows and columns. Located between adjacent rows of contacts 20 are racks 32 having attached thereto triangular projections 34 which engage the tip portions 26 and 28 of the contacts 20. The racks 32 are connected at one end to a guide 36 which moves with the rack 32 to move as will be described below. It can be seen in FIG. 2 that every other rack illustrated is connected to one of the guides 36 illustrated. This arrangement is such that every other rack 32 travels in the same direction with intermediate racks 32 traveling in the opposite direction. The direction of travel of two adjacent racks 32 is indicated by the arrows 38.

It will be noted that the tips 26 and 28 of adjacent rows of contacts 20 are offset in opposite directions, this allows one rack 32 with triangular projections 34 on each side to operate on two tips 26, 28 of two rows of contacts 20 and so reduce the complexity of the mechanism involved.

Figure 4:
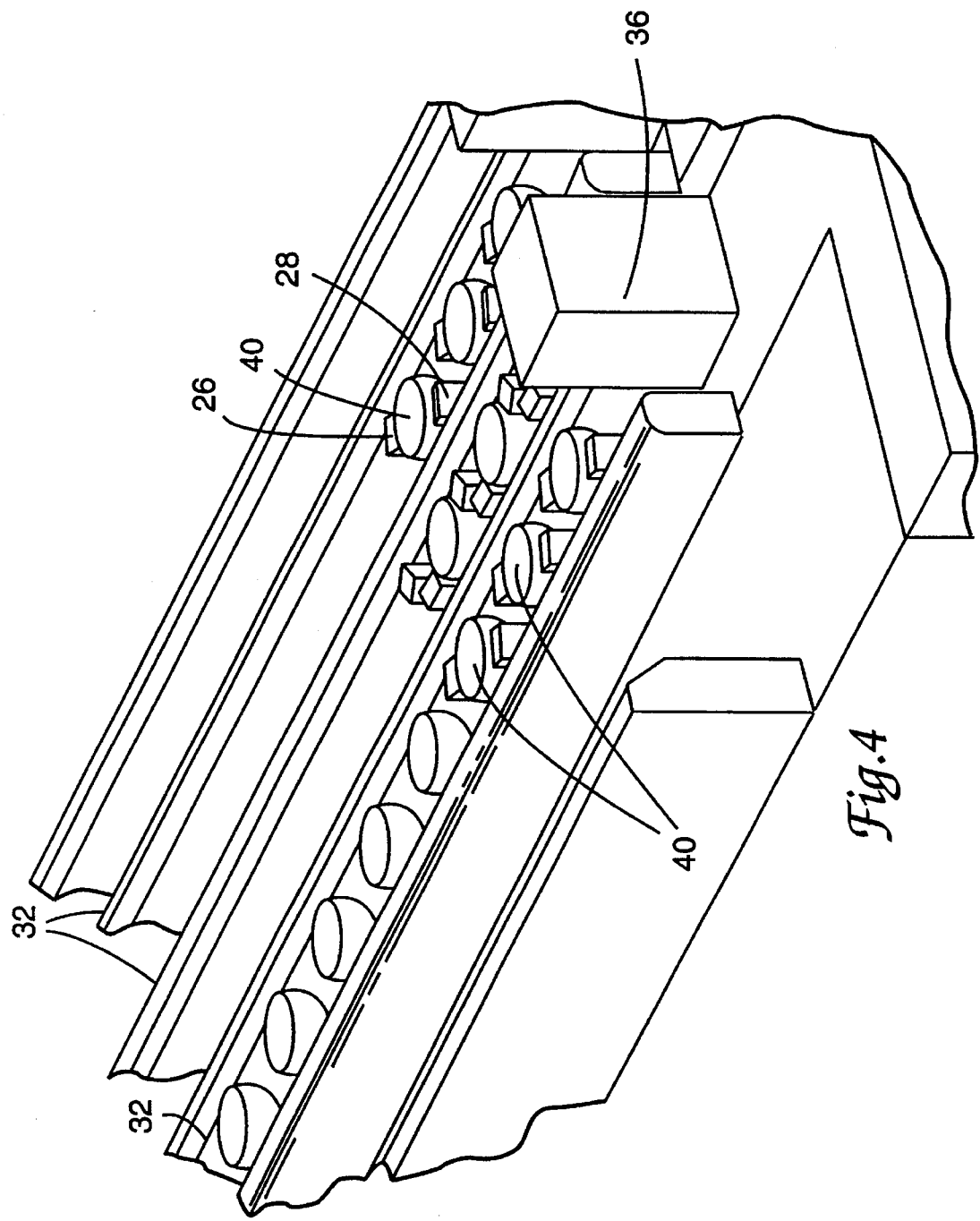
FIG. 4 is a perspective view, with a portion in cross-section, of contact actuating members of the test socket of FIG. 1.

FIG. 4 illustrates how the contacts 20 engage the solder balls 40 of a BGA device. The flat surfaces of the solder balls 40 indicate the plane at which the balls 40 are attached to the BGA device (not shown). As can also be seen in FIG. 3, the tips 26 and 28 of the contacts 20 are twisted toward each other so that the engagement surfaces of the tips 26 and 28 are tangential to the solder balls. This arrangement allows a maximum area of the contact tips 26 an 28 to contact the balls 40 and prevents any gouging of the balls 40. The amount of twist necessary to result in tangential engagement of the tips 26 and 28 and the solder balls 40 will depend upon the diameter of the balls 40. It will also be noted that the engagement portion of the tips 26 and 28 are bent inwardly where they engage the solder balls 40. This results in a downward force on the solder balls 40 which aids in the retention of the IC device within the socket 10.

Figure 5:
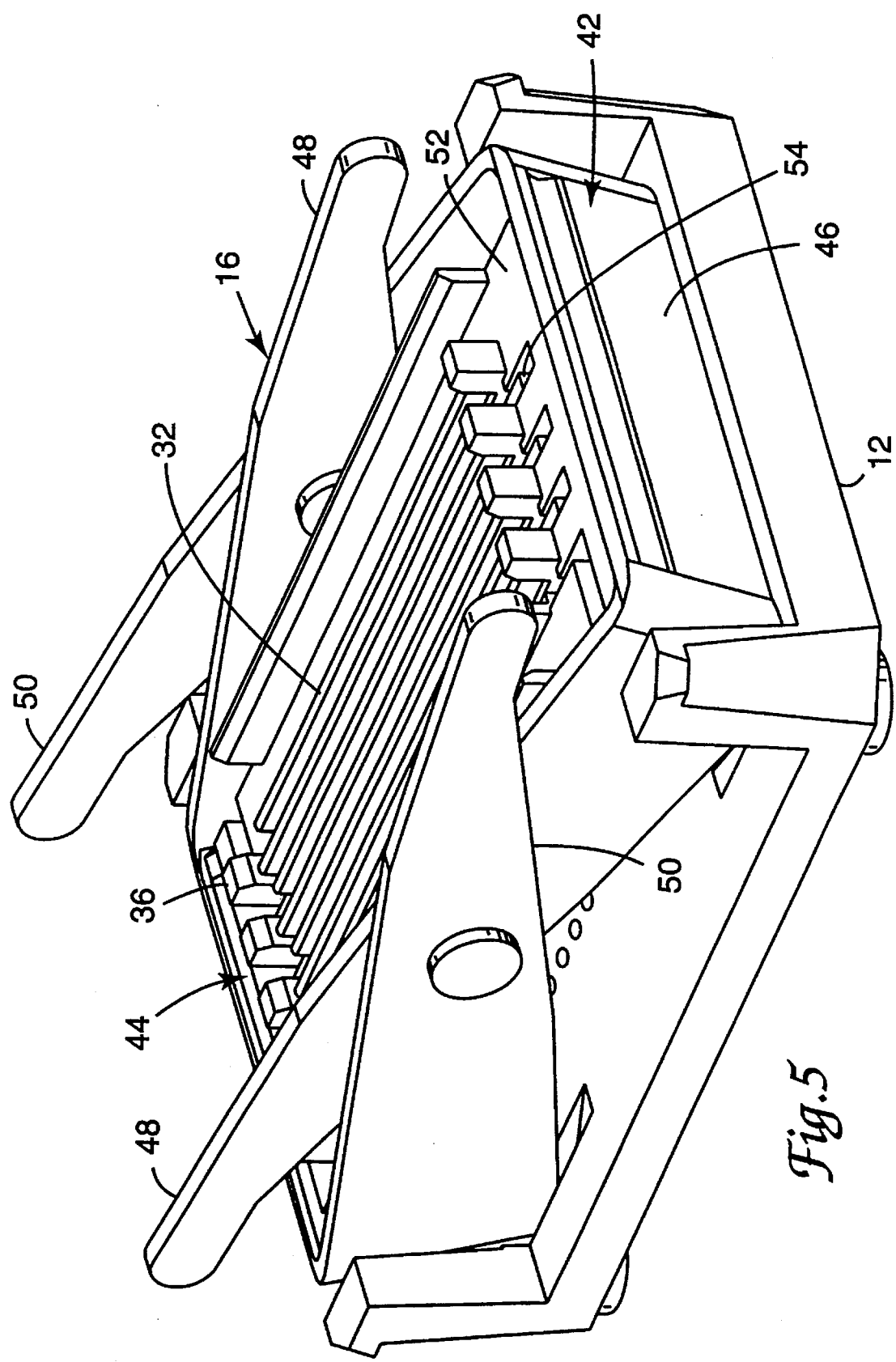
FIG. 5 is a perspective view of the test socket of FIG. 1 with the cover removed.

FIGS. 5 and 6 illustrate the socket 10 with the cover 14 removed to expose the operating mechanism 16 disposed within the socket 10. FIG. 5 illustrates the mechanism 16 in a position wherein the contacts 20 would be closed and thus would grip the solder balls 40 of a BGA device if one were in place within the socket 10. FIG. 6 illustrates the mechanism 16 in the open position wherein the contacts 20 are spread and ready to receive the solder balls 40 of the BGA device.

The mechanism 16 includes two identical U-shaped brackets 42 and 44 each having a formed cross piece 46 and two upstanding arms 48 and 50 extending substantially perpendicular to the cross piece 46. The two brackets 42 and 44 are nested facing each other and have their arms 48 and 50 pinned to each other at approximately their midpoints with a hole and slot arrangement which allows the arms 48 and 50 of each bracket 42 and 44 to slide relative to each other as the ends of the arms 48 and 50 move up and down. The lower portions of the cross pieces 46 are pivoted within slots in the base 12 and the upper portions of the cross pieces 46 engage the ends of the racks 32 which include the guides 36. The dimensions of the brackets 42 and 44 are chosen such that the upper portions of the cross pieces 46 are forced apart, and thus the arms 48 and 50 forced upwardly, when the contacts 20 are closed and thus the guides 36 are at their maximum separation. That the guides 36 are at their maximum separation is illustrated by comparing the positions of the plate 52 which supports the guides 36 on the right side of the socket 10 and the ends 54 of the racks 32 adjacent these guides 36. In FIG. 5, which corresponds to the closed position of the contacts 20, there is a large separation between the ends 54 of the racks 32 and the plate 52, which indicates that the guides 36 are at their widest separation. In FIG. 6, which corresponds to the open position of the contacts 20, the ends of the racks 32 have fully approached the plate 52, indicating maximum travel of the racks 32 and thus full opening of the contacts 20.

To insert a BGA device in the socket 10, the cover 14 is depressed which forces the ends of the arms 48 and 50 downwardly. This motion of the arms 48 and 50 causes the upper portions of the cross pieces 46 to approach each other and thus force the guides 36 and their associated racks 32 toward each other to open the contacts 20. The guides 36 are then in a position to define the placement of the BGA device on the top of the racks 32.

Once the BGA device is placed between the guides 36, the solder balls 40 attached to its bottom side are positioned within the open contacts 20 and the socket 10 is ready to be closed. Releasing the downward pressure on the cover 10 allows the natural resiliency of the contacts 20 to cause the contacts 20 to close around the solder balls 40. At the same time, the racks 32 are forced in opposite directions to fully separate the guides 36. This action raises the arms 48 and 50 and thus the cover 14.

Thus there has been described a test and burn-in socket for ball grid array integrated circuit devices which uses two contact arms to grip each solder ball of the device Since two arms are used, forces are balanced on the device and a large contact area per ball is defined which prevents damage to the solder balls.

Although the invention has been described with respect to only a single embodiment, it will be recognized to those skilled in the art that many modifications are possible. For example, the cover could be removed entirely and the arms actuated directly. In addition, the arms could be longer or shorter to require a greater or lesser travel of the cover.

I claim:

1. A test socket for temporary connection of a ball grid array integrated circuit device to a test circuit, the test socket comprising:

a base of electrically insulating material;

an array of contacts supported by said base, said array at least including a pattern of contacts corresponding to the ball grid array of the integrated circuit device, each contact including a set of two cantilever arms biased toward each other and terminating in tips adapted to capture one ball of the ball grid array integrated circuit device;

means for simultaneously separating each of said sets of said array of contacts so that the balls of the ball grid array device maybe inserted one within each of said set of contact arms.

2. A test socket according to claim 1 wherein said tips of said contacts are offset with respect to the direction of movement of said tips and wherein said tips are twisted toward each other to engage the balls over a maximum area.

3. A test socket according to claim 1 wherein said means for separating said contact tips includes a rack associated with each of said tips and means for forcing adjacent racks in opposite directions.

4. A test socket according to claim 3 wherein said means for forcing said racks in opposite directions includes a linkage of two U-shaped pieces each of a cross piece and two upstanding arms, and wherein said arms are connected such that pressure on said arms at a point distant from said cross pieces causes said cross pieces to approach each other, and wherein said racks are disposed between said cross pieces and move with motion of said cross pieces.

5. A test socket according to claim 4 further including a cover including an opening for accepting a ball grid array device and a surface contacting said arm ends to pressure said arms as said cover is depressed and thus cause said cross pieces to approach each other.

6. A test socket according to claim 5 further including means on said base and said cover for cooperatively guiding said cover with respect to said base as said cover is depressed.

* * * * *